US007675164B2

(12) United States Patent
Bartley et al.

(10) Patent No.: US 7,675,164 B2
(45) Date of Patent: Mar. 9, 2010

(54) METHOD AND STRUCTURE FOR CONNECTING, STACKING, AND COOLING CHIPS ON A FLEXIBLE CARRIER

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew Benson Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 11/682,363

(22) Filed: Mar. 6, 2007

(65) Prior Publication Data

US 2008/0218974 A1 Sep. 11, 2008

(51) Int. Cl.
*H01L 23/367* (2006.01)

(52) U.S. Cl. ................ 257/718; 257/719; 257/E23.068

(58) Field of Classification Search ................ 257/718, 257/E23.065
See application file for complete search history.

(56) References Cited

U.S. PATENT DOCUMENTS

| | | | | |
|---|---|---|---|---|
| 5,926,369 | A | 7/1999 | Ingraham et al. | |
| 6,785,144 | B1 | 8/2004 | Akram | |
| 6,992,376 | B2 | 1/2006 | Jaeck | |
| 7,446,410 | B2 * | 11/2008 | Wehrly et al. ............... | 257/707 |
| 2001/0006252 | A1 * | 7/2001 | Kim et al. ................... | 257/688 |
| 2003/0070790 | A1 * | 4/2003 | Chen et al. ................. | 165/80.3 |

* cited by examiner

*Primary Examiner*—Sue Purvis
*Assistant Examiner*—Krista Soderholm
(74) *Attorney, Agent, or Firm*—Robert R. Williams

(57) ABSTRACT

A heat sink apparatus having a plurality of chips attached to a first surface of a flexible carrier and a plurality of heat sink fins. One or more additional chips may be attached to a second surface of the flexible carrier. The flexible carrier has at least one complementary fold, the complementary fold having a counterclockwise fold and a clockwise fold as seen from the side. A first chip back surface of a first chip and a second chip back surface of a second chip are in thermal contact with a particular heat sink fin, that is, sharing the same heat sink fin. Thermal contact between the chips and heat sink fins is effected by force, by thermally conducting adhesive, by thermal grease, or by a combination of force and/or thermally conducting adhesive and/or thermal grease.

15 Claims, 6 Drawing Sheets

98 112 120 102 103 99 104 100A 98 106 102 99 91 90 98 102 99 98 102 99 113 107 108

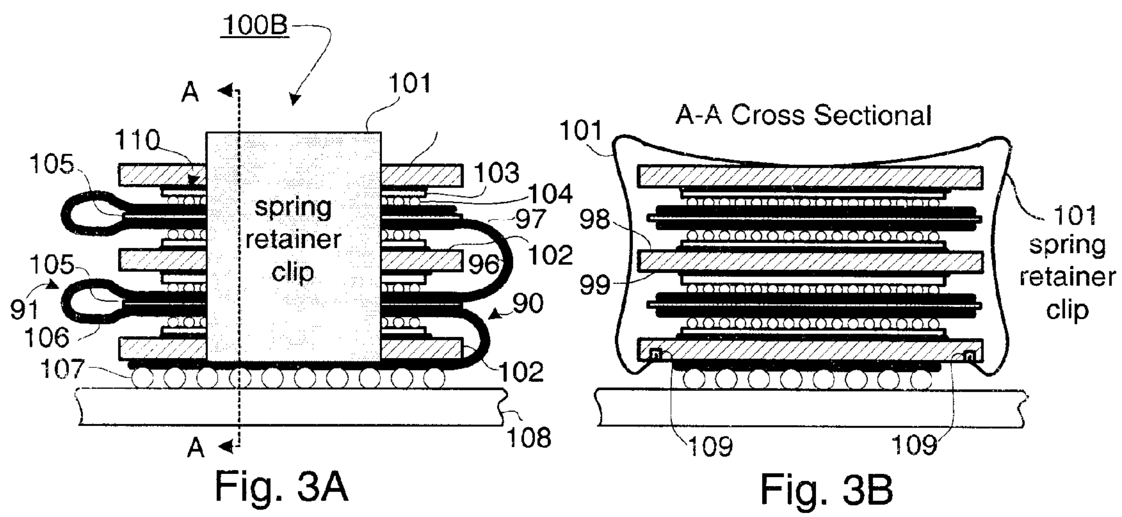
Fig. 3A
Fig. 3B
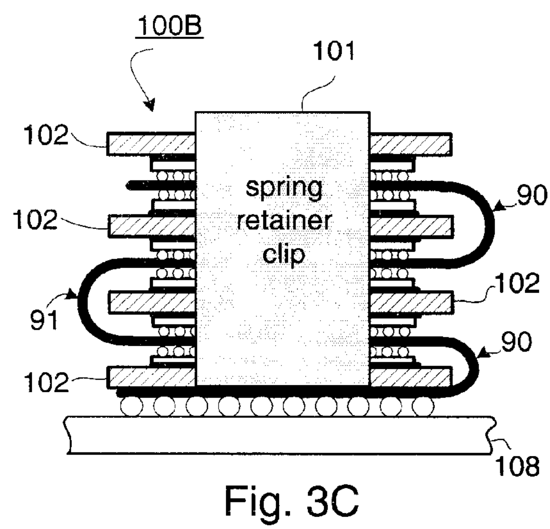
Fig. 3C 200
202
START
204
FOLD A FLEXIBLE CARRIER HAVING CHIPS MOUNTED THEREON
206
PLACE THE FOLDED FLEXIBLE CARRIER BETWEEN SEGMENTS OF A HEAT SINK
208
USE A THERMALLY CONDUCTIVE ADHESIVE TO BOND AT LEAST ONE OF THE CHIPS TO A SEGMENT OF THE HEAT SINK
210
END 220
222
START 224
FOLD A FLEXIBLE CARRIER HAVING CHIPS MOUNTED THEREON
226
PLACE THE FOLDED FLEXIBLE CARRIER BETWEEN SEGMENTS OF A HEAT SINK
228
PRESS ONE OR MORE CHIPS AGAINST A SEGMENT OF THE HEAT SINK
230
END

METHOD AND STRUCTURE FOR CONNECTING, STACKING, AND COOLING CHIPS ON A FLEXIBLE CARRIER

BACKGROUND OF THE INVENTION

1. Field of the Invention

This invention relates generally to packaging of semiconductor chips, and more particularly to semiconductor chips attached on a flexible carrier.

2. Description of the Related Art

Modern electronic systems typically use a number of semiconductor chips to implement a desired function. For example, an electronic system may comprise one or more processor chips that further comprise arithmetic logic units (ALU), registers, and the like. The electronic system may also comprise a number of memory chips, such as DRAM (Dynamic Random Access Memory), SRAM (Static Random Access Memory), or electrically programmable memory chips.

Semiconductor chips may be mounted on flexible carriers and the chips are then placed in thermal contact with a heat sink. Thermal contact may be made using a force to press a chip against a heat sink, or may further comprise use of thermally conducting adhesive or thermal grease.

Existing methods of stacking and cooling chips that are attached to a flexible carrier do not make optimal use of fins on a heat sink, in particular when a relatively large number of chips are attached to the flexible carrier. Density of existing packaging in which chips are mounted on flexible carriers and in which the chips require thermal contact to heat sinks is not optimal.

Therefore, there is a need for a method and apparatus for supporting a flexible carrier having chips mounted thereon and for providing thermal contacts between the chips and the heat sink in a dense manner.

SUMMARY OF THE INVENTION

The present invention provides a method and a heat sink apparatus for compactly packaging and cooling a plurality of semiconductor chips.

A flexible carrier has a plurality of chips attached to a first side of the flexible carrier. In another embodiment, the flexible carrier also has at least one chip attached to a second side of the flexible carrier. The flexible carrier has at least one complementary fold, the complementary fold comprising a clockwise fold and a counterclockwise fold as seen from the side. The folded flexible carrier is placed between heat sink fins such that a first back chip surface of a first chip has a thermal contact to a top surface of a particular heat sink fin, and a second back chip surface of a second chip has a thermal contact to a bottom surface of the particular heat sink fin. In other words, the first chip and the second chip both have thermal contacts to the same heat sink fin.

The flexible carrier may comprise a number of clockwise and counterclockwise folds to provide for additional heat sink fins to cool chips on both top surfaces and bottom surfaces of the additional heat sink fins.

BRIEF DESCRIPTION OF THE DRAWINGS

FIGS. 3A and 3B show an embodiment of a heat sink structure thermally coupled to a plurality of chips attached to a flexible carrier and a cross sectional view of the heat sink structure.

FIG. 3C shows an embodiment of the heat sink structure that is similar to that shown in FIGS. 3A and 3B but having chips attached to both a first surface and a second surface of the flexible carrier, the second surface being opposite to the first surface.

DETAILED DESCRIPTION OF THE PREFERRED EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention provides method and apparatus for mechanically supporting and cooling a plurality of semiconductor chips attached to a flexible carrier in a compact manner.

Figure 1A:
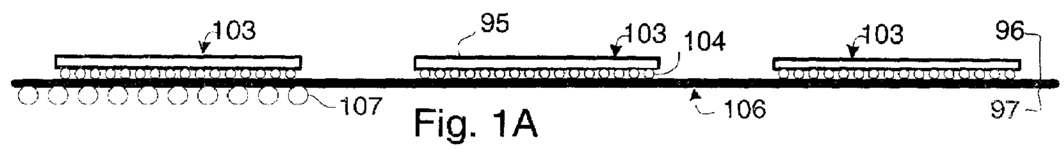
FIGS. 1A, 1B, and 1C show a top view of and side views of a flexible carrier having semiconductor chips attached thereon.
Figure 1B:
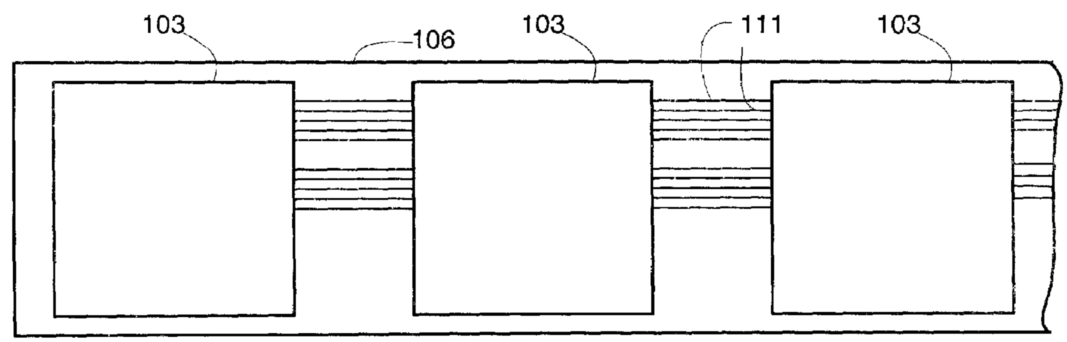

FIGS. 1A and 1B respectively show a side view and a top view of a flexible carrier 106 upon which is attached a plurality of semiconductor chips 103. Chips 103 each have a back chip surface 95. Semiconductor chips 103 are attached to a first surface 96 of flexible carrier 106 by connectors 104. A second surface 97 of flexible carrier 106 shown in FIG. 1B does not have chips 103 attached. In another embodiment, shown in side view in FIG. 1C, flexible carrier 106 has at least one chip 103 attached to the second surface 97 of flexible carrier 106 as well as a plurality of chips 103 attached to the first surface 96. In embodiments, connectors 104 are solder ball connectors, such as are known in the art. The balls may not be "solder" as such, and the term is intended to encompass any material that can be reflowed by heating followed by cooling to produce a mechanical and electrical connection. Other connectors 104 are contemplated. It will further be appreciated that chips 103 may be further mounted upon modules, with modules being mechanically and electrically attached to flexible carrier 106. For example, a chip may be mounted on a BGA (ball grid array) package (module) that is, in turn, attached to flexible carrier 106 by connectors 104. TSOP (Thin Small Outline Package), gull-wing packaging, are other examples of modules upon which chips may be mounted, with the module then attached to flexible carrier 106. For purposes of explanation hereinafter, chips 103 are shown attached to flexible carrier 106, but it is understood that a chip 103 may be also mounted on a module that is then attached to flexible carrier 106.

Figure 1C:
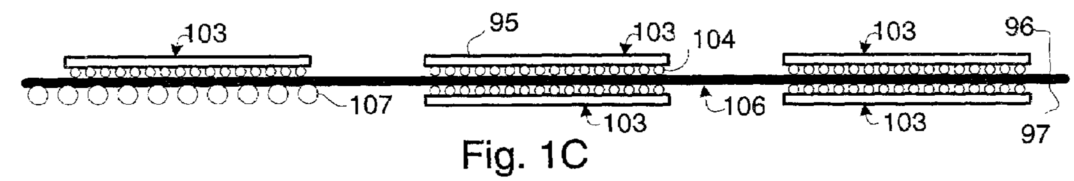

FIG. 1A and FIG. 1C also show connectors 107 which are used to attach flexible carrier 106 electrically and mechanically to another level of packaging as will be shown later.

In the top view seen in FIG. 1B, signals are routed along flexible carrier 106 on conductors 111. It will be appreciated that conductors 111 may in some embodiments, be on multiple levels (planes) of conductors within or upon flexible carrier 106. In addition, it will be appreciated that flexible carrier 106 may, in various embodiments, further comprise a "voltage plane"; in such embodiments, the voltage plane is often implemented as a mesh of conductors in order to preserve flexibility of flexible carrier 106. Typically, the voltage plane is coupled to "ground" (usually zero volts in an electronic system).

Figure 2:
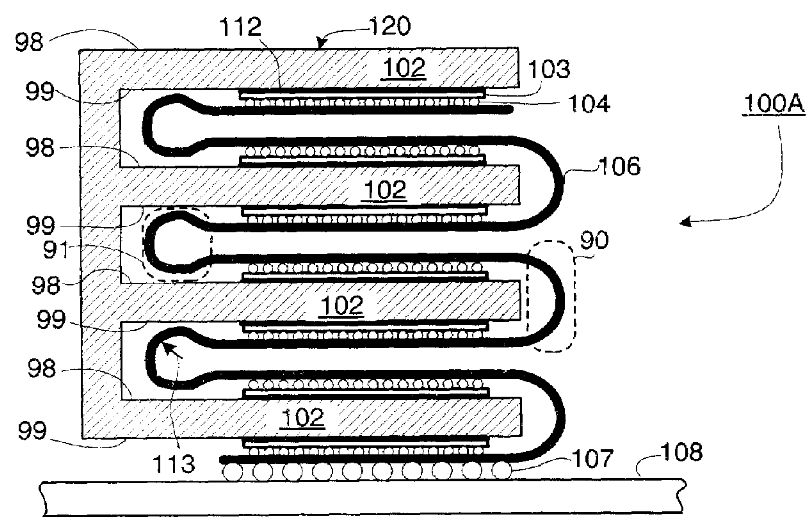
FIG. 2 shows a heat sink structure thermally coupled to a plurality of chips, the chips attached to a flexible carrier; the flexible carrier further attached to a second carrier.

FIG. 2 shows a heat sink structure 100A. Various embodiments of a heat sink structure 100 are herein identified by appending a letter. Heat sink structure 100A comprises the plurality of chips 103, the chips 103 being attached to the flexible carrier 106 by connectors 104. Each chip 103 is attached to a particular heat sink fin 102 of heat sink 120 using a thermally conductive adhesive 112 to bond each chip 103 back chip surface 95 (back chip surface 95 identified in FIG. 1A) to the particular heat sink fin 102. Any suitable thermally conductive adhesive product may be used for thermally conductive adhesive 112. For example, Shin-Etsu thermal gel X23-7772-4, made by Shin-Etsu MicroSi, Inc, 10028 S 51$^{st}$ St, Phoenix, Ariz., 85044, is a homogenous adhesive with fillers that enhance thermal conductivity, and is applied in grease form but cures after application. Heat sink 120 is constructed of a material suitable for heat transfer, such as aluminum, copper, steel, and the like. Heat sink 120 has a number of heat sink fins 102 as shown, upon which chips 103 are attached as described. Each heat sink fin 102 has a top surface 98 and an opposing bottom surface 99. At least one particular heat sink fin 102 has a first chip 103 attached to the top surface 98 of the at least one heat sink fin 102 and a second chip 103 attached to the bottom surface 99 of the at least one particular heat sink fin 102. The first chip 103 and the second chip 103 therefore are both thermally coupled to the same particular heat sink fin 102.

Flexible carrier 106 is folded, as shown in FIG. 2, such that the first surface 96 of flexible carrier 106 faces a bottom surface 99 of a particular heat sink fin 102 and a top surface 98 of another heat sink fin 102 that is adjacent to the particular heat sink fin 102. Flexible carrier 106 has one or more complementary folds. A complementary fold comprises a counterclockwise fold 90 and a clockwise fold 91, as seen from the side, as illustrated. In other words, a complementary fold is an "S-shaped" fold. In contrast, a "C-shaped" fold, or folds, involves folds that are all either clockwise folds or counterclockwise folds. Folded in this manner, a first portion of second surface 97 of flexible carrier 106 faces a second portion of second surface 97 of flexible carrier 106 between two adjacent heat sink fins 102.

Spacing of the heat sink fins 102 is selected to allow room for chips 103, thermally conductive adhesive 112, connectors 104, and enough space to provide a large enough radius 113 that flexible carrier 106 is not folded more tightly than specified for a particular flexible carrier 106. In FIG. 2, if radius 113 is a minimum radius for the particular flexible carrier 106 used, flexible carrier 106, with chips 103 and thermally conductive adhesive 112 must be inserted from the side of heat sink 120 between heat sink fins 102, that is, "into the drawing sheet", as depicted. In other embodiments flexible cable 106 can be inserted "from the right side" of the drawing sheet, as depicted, of heat sink 120 if there is enough space to allow such insertion between heat sink fin 102 without damaging flexible cable 106. In FIG. 2, heat sink structure 100A is shown to be attached to a parent carrier 108, using connectors 107, an attachment which may be implemented as solder balls, solder columns, or land grid array (LGA) connector. Parent carrier 108 is a higher level packaging carrier, such as a printed wiring board (PWB).

Heat sink structure 100A provides a dense packaging and cooling approach, providing a number of chips in a relatively small area. However, reworkability may be difficult, depending on the particular thermally conductive adhesive 112 used to bond chips 103 to heat sink 120. In some applications, reworkability is required and chips 103 must not be adhesively bonded to heat sink 120.

Turning now to FIGS. 3A, 3B, and 3C, a reworkable heat sink apparatus 100 heat sink apparatus 100B is depicted. FIG. 3A shows heat sink apparatus 100B; FIG. 3B shows a cross sectional view through AA.

Heat sink apparatus 100B comprises a plurality of heat sink fins 102 against which chips 103 are pressed for thermal contact. A non-adhesive thermal grease material 110 is optionally used, if needed, to enhance a thermal contact (also known as thermal interface) between a particular chip 103 and a heat sink fin 102. A number of manufacturers make and sell various thermal grease products, for examples, 3M Corporation, Dow Corning corporation, Artic Silver corporation, and Shin-Etsu corporation. Chips 103 are again attached to flexible carrier 106 using connectors 104. A spring retainer clip 101 is used to produce a predetermined force upon the stack of heat sink fins 102, chips 103, flexible carrier 106, and, if implemented, the non-adhesive thermal grease material 110. The value of the predetermined force is determined by a particular technology's allowable force per connector 104, the number of connectors 104 per chip 103, and requirements of thermal grease material 110, if thermal grease material 110 is implemented. Force exerted by spring retainer clip 101 is determined by a spring constant of the material (e.g., spring steel) of which spring retainer clip 101 is made, the shape of spring retainer clip 101, and the amount of deformation (stretch or compression) that exists on spring retainer clip 101 as it presses together chips 103, heat sink fins 102, and flexible carrier 106.

In heat sink apparatus 100B, heat sink fins 102 each have a top surface 98, a bottom surface 99 just as heat sink fins 102 of FIG. 2. For simplicity, only one top surface 98 and one bottom surface 99 are referenced in FIG. 3B. Similarly, flexible carrier 106, as explained earlier, has a first surface 96 upon which chips 103 are attached, and a second surface 97 upon which no chips 103 is attached in the embodiment shown in FIGS. 3A and 3B.

As described with reference to FIG. 2, flexible connector 106 is folded such that at least one heat sink fin 102 is thermally coupled to two instances of chip 103 in heat sink apparatus 100B shown in FIGS. 3A and 3B. Between adjacent heat sink fins 102, second surface 97 of a first portion of flexible carrier 106 faces second surface 97 of a second portion of flexible carrier 106. As with other embodiments of heat sink apparatus 100, flexible carrier 106 has at least one counterclockwise fold 90 and at least one clockwise fold 91.

In many applications, flexible carrier 106 can be pressed against itself. That is, second surface 97 on a first portion of flexible carrier 106 can be pressed against second surface 97 on a second portion of flexible carrier 106. In applications where flexible carrier 106 is not allowed to press against itself, separators 105 are used between folds of flexible carrier 106 as shown. For example, if flexible carrier 106 is not allowed to be pressed against itself because of concerns of short circuiting conducting elements in flexible carrier 106 such as conductors 111, or ground or voltage conductors (not shown), separators 105 are made of an insulating material such as plastic, glass, cardboard, or a resilient conductor such as resilient plastic, rubber, or the like).

In an embodiment, a retention groove 109 (shown in FIG. 3B) in heat sink fin 102 secures spring retainer clip 101. In another embodiment, the retention groove 109 is not required due to a shape of spring retainer clip 101 making a sufficiently secure mechanical grip on the bottom of heat sink fin 102.

FIG. 3C shows heat sink apparatus 100B where chips 103 are attached to both the first surface 96 and to the second surface 97 of flexible carrier 106. Two counterclockwise folds 90 and a clockwise fold 91 are referenced, along with four heat sink fins 102 shown in FIG. 3C. Spring retainer clip 101 produces the predefined force, as explained above with reference to FIGS. 3A and 3B.

It will be appreciated that, in an embodiment, heat sink apparatus 100B may implement thermally conductive adhesive 112 instead of thermal grease material 110, in particular if reworkability is not an issue. In other embodiments where an adequate thermal contact exists simply by pressing chips 103 against heat sink fins 102, neither thermal grease material 110 nor thermally conductive adhesive is used.

Figure 4A:
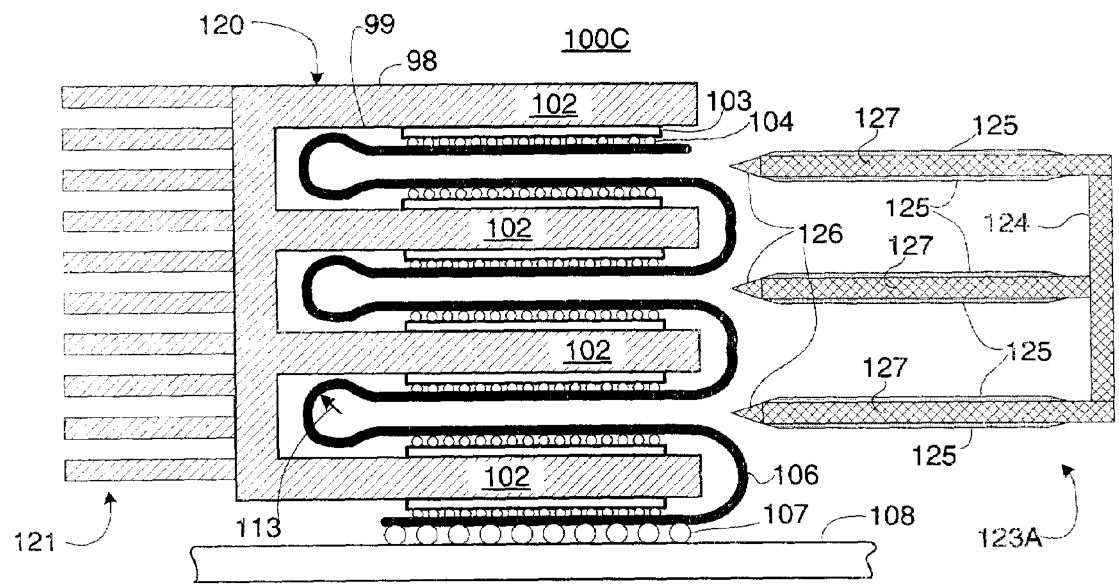
FIG. 4A shows an embodiment of a heat sink structure having heat sink fins, the heat sink fins thermally coupled to a plurality of chips attached to a flexible carrier and further comprising a resilient actuator. Auxiliary fins are shown to enhance cooling.
Figure 4B:
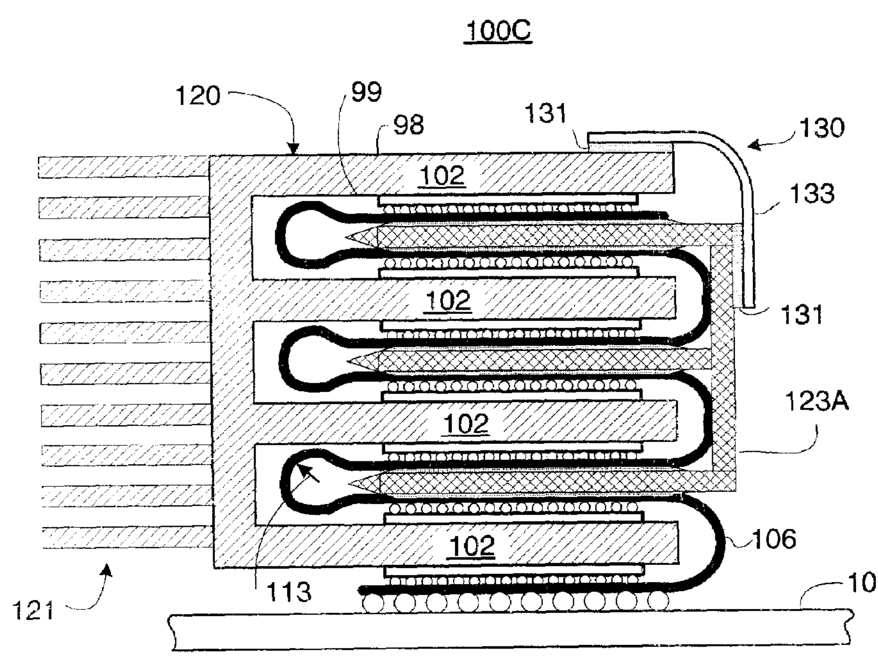
FIG. 4B shows the embodiment of the heat sink structure shown in FIG. 4A with the resilient actuator inserted. A retention device is also depicted.
Figure 4C:
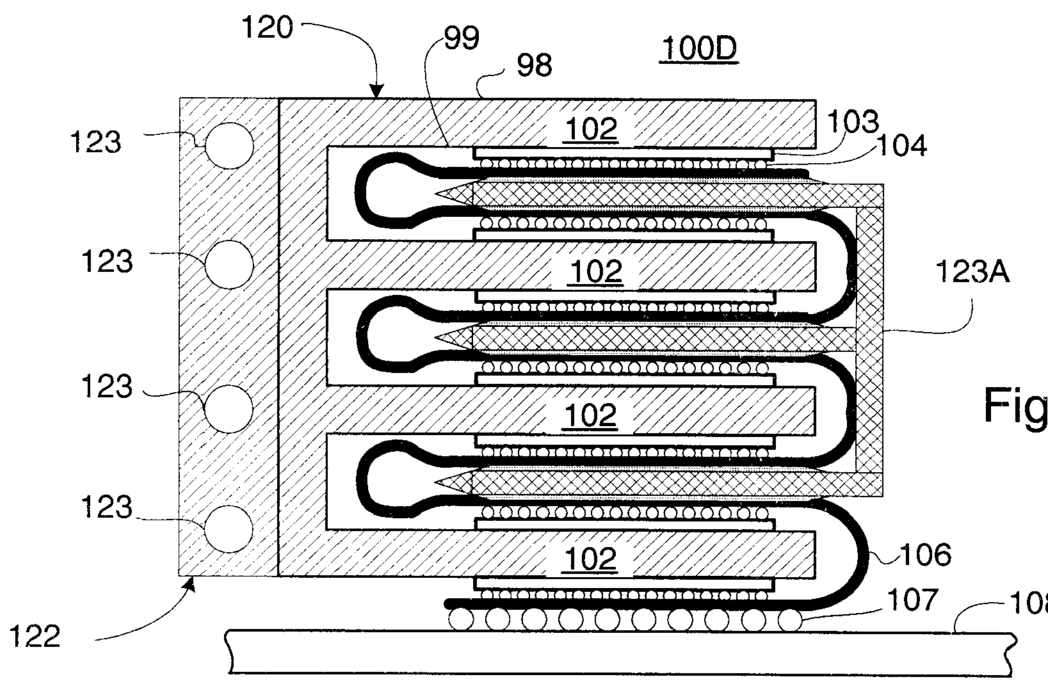
FIG. 4C shows an embodiment of a heat sink structure similar to that shown in FIGS. 4A and 4B but having a cooling block with holes suitable for transmitting heat to a fluid or for attaching heat pipes.

FIGS. 4A-4C show additional reworkable embodiments 100C and 100D of heat sink apparatus 100. For simplicity, top surfaces 98, bottom surfaces 99 of heat sink fins 102 are referenced only once each in FIGS. 4A-4C but are as shown and explained with reference to FIG. 2. Similarly, top surface 96 and bottom surface 97 of flexible conductor 106 are not numeraled in FIGS. 4A-4C but are as shown and explained with reference to FIG. 2.

FIGS. 4A and 4B show heat sink apparatus 100C having heat sink 120 (as earlier shown in FIG. 2). Heat sink apparatus 100C further comprises auxiliary fins 121 attached to heat sink 120 for improved cooling characteristics. A resilient actuator 123A is shown in FIG. 4A prior to insertion. Embodiments of resilient actuator 123 have characters appended to the reference numeral to distinguish among embodiments of resilient actuator 123. Resilient actuator 123A further comprises actuator fins 127. Actuator fins 127 may, in embodiments, be made of a resilient material (rubber, plastic, and the like). In an embodiment, actuator fins 127 may be made of a hard material such as steel or a hard plastic in combination with a resilient material (e.g., rubber, resilient plastic, foam, and the like). For example, in an embodiment, actuator fins 127 are made of steel (or other metal or hard plastic, or the like) and are coated with a resilient material 125 such as rubber, resilient plastic, or foam. In another embodiment (not shown), actuator fins 127 have a resilient core with a hard covering (e.g., metal, plastic, or the like).

In FIG. 4B, resilient actuator 123A is shown after insertion, with actuator fins 127 producing a predetermined force against surfaces of flexible carrier 106 as shown to, in turn, press chips 103 against heat sink 120. The predetermined force depends upon the characteristics of the resilient material and the amount of deformation of the resilient material that occurs as resilient actuator 125 is inserted as shown into heat sink apparatus 100C (or 100D) (FIGS. 4A, 4B, 4C).

It will be appreciated that thermally conductive adhesive 112 or thermal grease 110 may be used in embodiments to improve a thermal contact between chips 103 and heat sink fins 102.

In an embodiment, resilient actuator 123A has enough frictional force, once inserted, to remain securely in place. In another embodiment, shown in FIG. 4B, securing mechanism 130 is used to ensure that resilient actuator 123A is held securely. While many embodiments of securing mechanism 130 are contemplated, for purposes of example, securing mechanism 130 further comprises a connector 133 with hook and loop connections 131 that provide for secure retention of resilient actuator 123A in heat sink apparatus 100B, while allowing easy removal of resilient actuator 123A when removal is needed.

Resilient actuator 123A may further comprise a leading edge structure 126 on actuator fins 127 as shown to facilitate insertion of resilient actuator 123A. Leading edge structure 126 may be a tapered shape as shown, or a curved shape. Any suitable shape facilitating insertion of resilient actuator 123A between folds of flexible carrier 106 in heat sink apparatus 100C is contemplated. When geometries permit (e.g., minimum radius 113, shown in FIGS. 4A and 4B is not violated, resilient actuator 123A may be used to insert flexible carrier 106 between heat sink fins 102. That is, flexible carrier 106 is folded (using the complementary folding described earlier, with at least one clockwise fold and one counterclockwise fold, as seen from the side) about actuator fins 127 of resilient actuator 123A prior to inserting resilient actuator 123A into heat sink apparatus 100C or 100D.

FIG. 4C shows a heat sink apparatus 100D that is similar to heat sink apparatus 100C with the exception that, instead of auxiliary fins 121, cooling block 122 is coupled to heat sink 120 to enhance cooling capabilities of heat sink 120. Cooling block 122 further comprises holes 123 which are suitable for further coupling to heat pipes (not shown) or for passing a fluid.

Figure 4D:
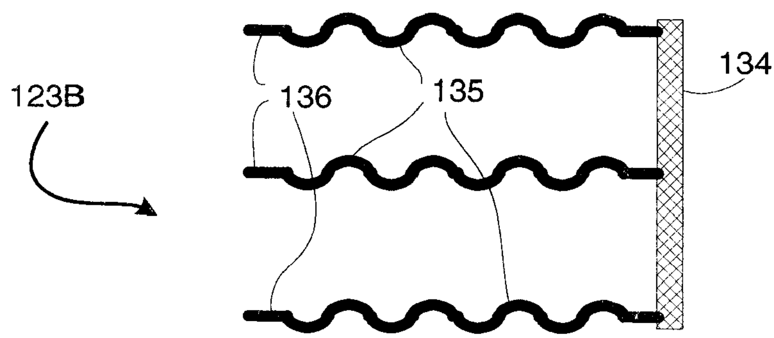
FIG. 4D shows an alternate embodiment of a resilient actuator.

FIG. 4D shows an additional embodiment of resilient actuator 123, designated 123B. Resilient actuator 123B further comprises a base 134 and actuator fins 135. Actuator fins 135 are constructed of a material such as spring steel, and having ripples that will press with a predetermined force against flexible carrier 106 when inserted between folds of flexible carrier 106. As described earlier, the predetermined force value is determined by a particular technology's specifications as to allowable force per connector 104 and the number of connectors 104. Force produced by an actuator fin 135 depends on the spring constant of the material that actuator fin 135 is made of, the geometries chosen for the ripples made in actuator fins 135, and the degree of compression of the ripples of actuator fins 135 as resilient actuator 123B is inserted into heat sink apparatus 100C or 100D. In an embodiment to facilitate insertion, leading edge structures 136 are created as shown. Leading edge structures 136 are at or near a midpoint of the ripples of actuator fins 135. That is, as shown, and with a "Y" axis running "north/south" on FIG. 4D, if the ripples on actuator fins 135 reach from +1 mm to −1 mm, (with 0 being the midpoint of the ripples), leading edge structures 136 would extend along the "0" value on the "Y" axis of each actuator fin 135.

It will be appreciated that, while only a single chip 103, for simplicity, is shown in the FIGS. 2, 3A, 3B, and 4A-4C, in thermal contact with any particular upper surface 98 or lower surface 99 of a particular heat sink fin, it will be appreciated that additional chips may be implemented along either the "x-axis" (that is, "east-west" in drawings 2, 3A, 3B, and 4A-4C) or in the "z-axis" (that is, "into the paper" in drawings 2, 3A, 3B, and 4A-4C).

Figure 5:
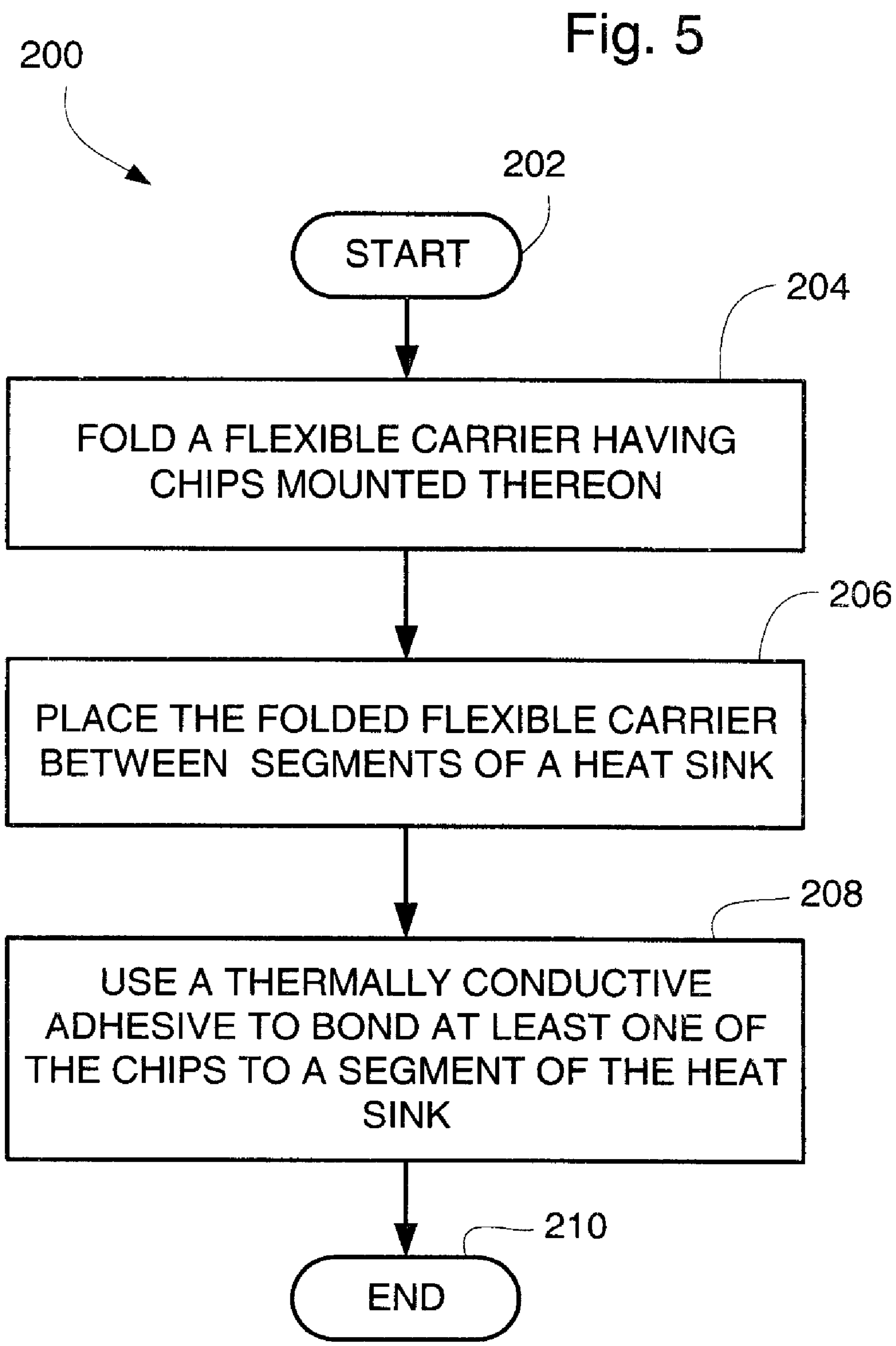
FIG. 5 is a flow chart of a method embodiment of the invention.

FIG. 5 shows a flow chart of method 200. Method 200 begins at step 202. In step 204, a flexible carrier (such as flexible carrier 106 shown in FIG. 2) having a plurality of chips attached thereon (such as chips 103 attached to flexible carrier 106 as shown in FIG. 2, FIGS. 3A-3C, or FIGS. 4A-4C) is folded in a complementary fold, the complementary fold having one or more counterclockwise folds and one or more clockwise folds, a seen from a side view.

In step 206, the folded flexible carrier 106 is placed between heat sink fins of a heat sink apparatus. The flexible carrier, with chips attached, may be placed between the heat sink fins by the methods explained earlier. In an embodiment, the flexible carrier, with chips attached, may slide in from a side of the heat sink apparatus. In a second embodiment, the flexible carrier, with chips attached, may be pushed in from an end of the heat sink apparatus. In a third embodiment, the flexible carrier, with chips attached, may have the heat sink fins placed, "sandwich-like" between the folds of the flexible carrier, as shown in FIGS. 3A and 3B. In step 208, chips 103 are mechanically and thermally coupled to the heat sink fins by placing a thermally conducting adhesive on the chips or on surfaces of the heat sink fins that will be in contact with the chips. After curing of the thermally conductive adhesive, the chips will be securely attached to the heat sink fins and will have a thermal transmission path through the cured thermally conducting adhesive to the heat sink fins. The heat sink fins may be further thermally and mechanically cooled by auxiliary fins, heat pipes, or other known means of enhancing transmission of heat. Step 210 ends method 200.

Figure 6:
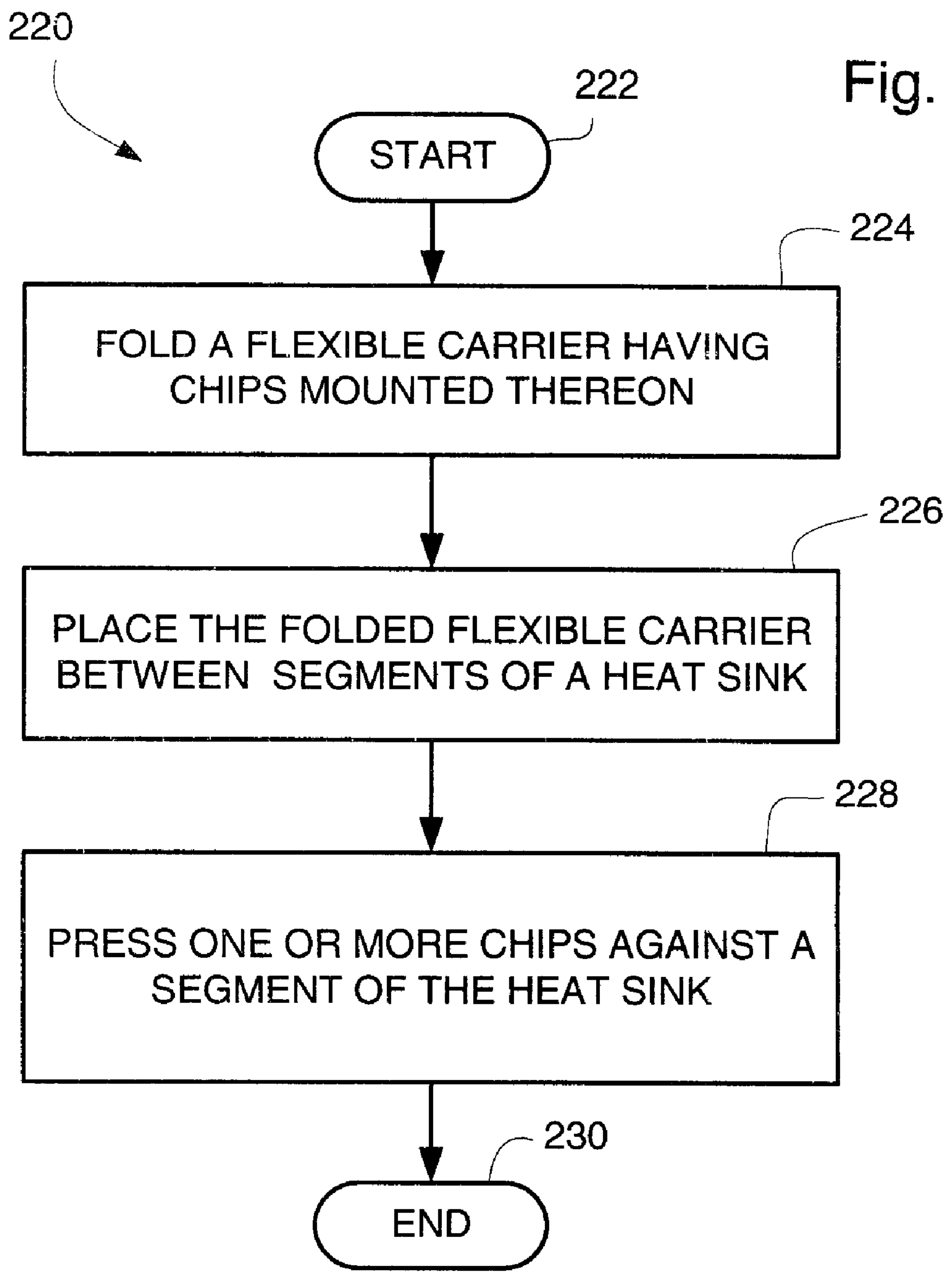
FIG. 6 is a flow chart of a method embodiment of the invention.

FIG. 6 shows a flow chart of method 220, similar to method 200, but providing for a reworkable heat sink apparatus. Step 222 begins method 220. In step 224, a flexible carrier having chips mounted thereon is folded in a complementary fold. FIG. 4A, for example, shows flexible carrier 106 having a plurality of chips 103 mounted upon a first surface of flexible carrier 106; with flexible carrier 106 being folded as shown in FIG. 4A. In other embodiments, such as shown in FIG. 3C, chips are mounted upon both the first surface and the second surface of flexible carrier 106. In step 226, the folded flexible carrier and the chips attached thereto are placed between heat sink fins of a heat sink. FIG. 4A shows folded flexible carrier 106, with chips 103 mounted thereon placed between sink fins 102 on heat sink 120.

In step 228, one or more of the chips mounted on the first surface of the flexible cable are pressed against heat sink fins of the heat sink. Methods of pressing chips against heat sink fins were shown and described in reference to FIGS. 3A, 3B, 3C, 4A, 4B, and 4C. Step 230 ends method 220.

What is claimed is:

1. A heat sink apparatus comprising:

a plurality of heat sink fins, each heat sink fin having a top surface and a bottom surface;

a flexible carrier having a first surface and a second surface, the flexible carrier having a complementary fold, the complementary fold having a clockwise fold and a counterclockwise fold as seen from the side;

a plurality of chips attached to a first surface of the flexible carrier;

wherein a particular heat sink fin has a top surface in thermal contact with a first back chip surface of a first chip, and the particular heat sink fin has a bottom surface in thermal contact with a second back chip surface of a second chip; and a resilient actuator, the resilient actuator configured to press the first back chip surface against the top surface of the particular heat sink fin, and to press a third back chip surface against a bottom surface of a second particular heat sink fin.

2. The heat sink apparatus of claim 1, further comprising at least one chip attached to the second surface of the flexible carrier, the at least one chip having a chip back surface in thermal contact with a heat sink fin in the plurality of heat sink fins.

3. The heat sink apparatus of claim 1, the thermal contact further comprising a thermally conductive adhesive.

4. The heat sink apparatus of claim 1, the thermal contact further comprising thermal grease.

5. The heat sink apparatus of claim 1 further comprising a spring retainer clip to press a back chip surface against a heat sink fin.

6. The heat sink apparatus of claim 5, further comprising a retention groove in a heat sink fin configured to secure the spring retainer clip.

7. The heat sink apparatus of claim 5, further comprising a separator located between a first portion of the second surface of the flexible carrier and a second portion of the second surface of the flexible carrier.

8. The heat sink apparatus of claim 1, the resilient actuator further comprising at least one actuator fin.

9. The heat sink apparatus of claim 8, the actuator fin further comprising a leading edge, the leading edge configured to facilitate an insertion of the actuator fin between a first portion of the second surface of the flexible carrier and a second portion of the second surface of the flexible carrier.

10. The heat sink apparatus of claim 9, wherein the leading edge is tapered.

11. The heat sink apparatus of claim 10, wherein the leading edge is rounded.

12. The heat sink apparatus of claim 8, the at least one actuator fin further comprising: a nonresilient portion and a resilient portion.

13. The heat sink apparatus of claim 1, further comprising an auxiliary fin configured to enhance cooling by providing additional surface area to air.

14. The heat sink apparatus of claim 1, further comprising a cooling block configured to pass a fluid suitable to enhance cooling.

15. The heat sink apparatus of claim 1, further comprising a plurality of complementary folds, thereby providing for a number of the plurality of heat sink fins to each have top surfaces of the number of the plurality of heat sink fins in thermal contact with a first number of chips in the plurality of chips and bottom surfaces of the number of the plurality of heat sink fins in thermal contact with a second number of chips in the plurality of chips.

* * * * *